(12) United States Patent
Köhler et al.

(10) Patent No.: US 11,354,776 B2
(45) Date of Patent: Jun. 7, 2022

(54) TEMPERATURE-DEPENDENT CORRECTION OF MAGNETIC RESONANCE IMAGE DATA

(71) Applicant: Siemens Healthcare GmbH, Erlangen (DE)

(72) Inventors: Michael Köhler, Nuremberg (DE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 48 days.

(21) Appl. No.: 16/891,704

(22) Filed: Jun. 3, 2020

(65) Prior Publication Data
US 2020/0388008 A1    Dec. 10, 2020

(30) Foreign Application Priority Data

Jun. 7, 2019    (DE) .......................... 102019208343.9

(51) Int. Cl.
*G06T 5/00*    (2006.01)
*G06T 7/00*    (2017.01)

(52) U.S. Cl.
CPC ............ *G06T 5/001* (2013.01); *G06T 7/0012* (2013.01); *G06T 2207/10088* (2013.01); *G06T 2207/30004* (2013.01)

(58) Field of Classification Search
CPC .................. G06T 5/001; G06T 7/0012; G06T 2207/10088; G06T 2207/30004

USPC ........................................................ 382/128
See application file for complete search history.

(56) References Cited

U.S. PATENT DOCUMENTS

| | | | | |
|---|---|---|---|---|
| 5,999,204 A | * | 12/1999 | Kojima | ..................... B41J 2/365 347/190 |
| 6,064,206 A | * | 5/2000 | Van Vaals | .......... G01R 33/4804 324/309 |
| 2009/0240379 A1 | | 9/2009 | Feiweier | |
| 2012/0001635 A1 | * | 1/2012 | Ookawa | ........... G01R 33/56563 324/314 |
| 2015/0323637 A1 | | 11/2015 | Beck | |
| 2020/0249305 A1 | | 8/2020 | Paul | |

FOREIGN PATENT DOCUMENTS

DE    102008015261 B4    11/2009

OTHER PUBLICATIONS

German Office Action for German Application No. 10 2019 208 343.9 dated Apr. 29, 2020.

* cited by examiner

*Primary Examiner* — Wednel Cadeau
(74) *Attorney, Agent, or Firm* — Lempia Summerfield Katz LLC

(57) ABSTRACT

The disclosure relates to a method for correcting image data acquired by a magnetic resonance device, a magnetic resonance device, and a computer program product. According to the method, first navigator data, image data, and second navigator data are acquired. Moreover, temperature values of the magnetic resonance device are determined. The image data is corrected based on the first navigator data, the second navigator data, and the temperature values.

19 Claims, 7 Drawing Sheets

10 Magnetic resonance device
11 Magnet unit
12 Main magnet
13 Main magnetic field
14 Patient receiving area
15 Patient
16 Patient support apparatus
17 Patient couch
18 Gradient coil unit 19 Gradient control unit
20 Radio-frequency antenna unit
21 Radio-frequency antenna control unit
22 System control unit
23 User interface
24 Display unit
25 Input unit
26 Temperature detection unit

TEMPERATURE-DEPENDENT CORRECTION OF MAGNETIC RESONANCE IMAGE DATA

The present patent document claims the benefit of German Patent Application No. 10 2019 208 343.9, filed Jun. 7, 2019, which is hereby incorporated by reference.

TECHNICAL FIELD

The disclosure relates to a method for correcting image data acquired by a magnetic resonance device. The disclosure also relates to a magnetic resonance device and a computer program product.

BACKGROUND

Imaging methods are important aids in medical technology. Magnetic resonance images of an examination object may be produced with particularly high and variable soft tissue contrasts by magnetic resonance (MR). The magnetic resonance images may be reconstructed from image data, which has been acquired by a magnetic resonance device. For spatially encoding the image data, magnetic field gradients, (e.g., frequency and phase encoding gradients), are generated during the acquisition of the image data by a gradient coil unit.

In particular, the magnetic resonance device may be heated by the operation of the gradient coil unit. This heating may negatively influence the quality of the reconstructed magnetic resonance images. For instance, heating a main magnet of the magnetic resonance device may change the Larmor frequency. This may result in a deviation between actual and intentional position of an acquisition slice, for instance. Furthermore, the spatial information assigned to the image data may be defective as a result of a changing Larmor frequency. This and further effects caused by a temperature drift may impair the reconstructed magnetic resonance images.

SUMMARY AND DESCRIPTION

The object of the disclosure may be considered to be that of avoiding such temperature-related artifacts.

The scope of the present disclosure is defined solely by the appended claims and is not affected to any degree by the statements within this summary. The present embodiments may obviate one or more of the drawbacks or limitations in the related art.

A method for correcting image data acquired by a magnetic resonance device is thus proposed. In this context, first navigator data, image data, and second navigator data are acquired. Moreover, temperature values of the magnetic resonance device are determined. The image data is corrected based on the first navigator data, the second navigator data, and the temperature values.

The image data may include magnetic resonance signals. The image data may include raw image data. The image data may be acquired, (e.g., recorded and/or measured), in particular with a radiofrequency antenna unit of the magnetic resonance device.

The image data may include data which may be arranged in a k-space. A k-space may be a two or three-dimensional data model including digitalized raw image data. A k-space may include k-space lines which represent a phase-encoded portion of the image data. k-space lines may be detected with a Cartesian sampling of the k-space.

The image data is advantageously embodied to be able to reconstruct one or more, (e.g., diagnostically meaningful), magnetic resonance images of an examination object therefrom. One such reconstruction may include a Fourier transformation, for instance. The magnetic resonance images may be made available in electronic form, stored, shown on a display unit, or a combination thereof.

The first navigator data may include a first navigator signal. The second navigator data may include a second navigator signal. Navigator data may include spin echo signals and/or gradient echo signals to detect changes in position of the examination object in the measuring volume, for instance, by reading out navigator slices. The navigator data alone may not be suited to reconstructing one or more, (e.g., diagnostically meaningful), magnetic resonance images of the examination object therefrom. The acquisition of the navigator data therefore may take place in addition to the diagnostic image data. The first navigator data may be considered as a reference for the second navigator data, from which temperature-dependent changes may be derived.

The temperature values may be values which describe the temperature of the magnetic resonance device, e.g., one or more components of the magnetic resonance device. For instance, the temperature values describe the temperature of a gradient coil unit of the magnetic resonance device. The gradient coil unit may include a number (e.g., plurality) of gradient coils (e.g., three gradient coils).

Temperature values may include an item of time information as a function of the time instants of the acquisition of the first navigator data, the image data, and the second navigator data. In particular, the first navigator data, the image data, and the second navigator data also include an item of time information, so that a relative temporal assignment of the temperature values to the acquired navigator data and image data is possible based on this time information and the time information of the temperature values. In particular, the image data may be divided into image data of a number of k-space portions, to which an item of time information is to be assigned in each instance.

The determination of the temperature values may take place at the same time as the acquisition of the first navigator data, the image data, and/or the second navigator data. The determination of the temperature values may also take place after acquiring the first navigator data, the image data, and/or the second navigator data.

Acquisition of the first navigator data may take place before acquisition of the second navigator data. A period of at least 100 milliseconds, (e.g., at least 500 milliseconds), may lie between the end of the acquisition of the first navigator data and the start of the acquisition of the second navigator data.

At least one part of the image data may be acquired between the end of the acquisition of the first navigator data and the start of the acquisition of the second navigator data. This part of the image data may include at least one k-space portion, at least three k-space portions, or at least ten k-space portions. Here, a k-space portion may be a k-space line.

The acquisition of the first navigator data may take place at the start of or before the acquisition of the image data. The acquisition of the second navigator data may take place at the end of or after the acquisition of the image data.

If the image data is acquired in the form of k-space lines, for instance, the first navigator data may be detected before or with the first acquired k-space line and the second navigator data may be detected with or after the last acquired k-space line.

The correction of the image data may be carried out with a computer unit, which includes one or more processors and/or electronic memories, for instance.

One or more magnetic resonance images, which advantageously have fewer temperature-related artifacts, may be reconstructed from the corrected image data.

In particular, a change, (e.g., a drift), in a temperature-dependent parameter may be determined from a comparison of the first navigator data with the second navigator data. A temperature-dependent parameter may be a temporal echo position, a phase, and/or a frequency, for instance. Advantageously, the temperature-dependent effects associated with these parameters may be corrected in the image data.

A change, (e.g., a drift), in a temporal echo position may manifest itself in that the timing of an echo varies. This may be observed as a linear increase in the image space along the read-out direction. The temporal echo position may be the time instant of a measured echo. This effect may be corrected in the image space, in particular, by a position-dependent phase correction, (e.g., after a Fourier transformation of the raw image data).

A further embodiment of the method provides that the determination of the temperature values includes a measurement of at least one temperature value with a temperature detection unit.

The temperature detection unit may include at least one temperature sensor. Exemplary temperature sensors are a thermistor, a semiconductor temperature sensor, a thermoelement, a pyrometer, etc. The temperature sensor may be arranged at a position of the magnetic resonance device at which heat is produced by the operation of the magnetic resonance device, e.g., at a gradient coil unit of the magnetic resonance device. The temperature detection unit may be with a system control unit of the magnetic resonance device, in which the temperature values and the first navigator data and the second navigator data are processed.

The at least one temperature value may be measured with a temperature detection unit during the acquisition of the image data. This may take place continuously or at temporal intervals.

A further embodiment of the method provides that the determination of the temperature values includes an interpolation of measured temperature values. In particular, if the measurement of temperature values with a temperature detection unit takes place at temporal intervals, additional temperature values may be generated by an interpolation of the measured temperature values. Temperature values may be generated for time instants at which the acquisition of the image data takes place. In particular, temperature values may be generated for time instants at which the acquisition of the image data of specific k-space lines takes place. Advantageously, the correction of this image data, (e.g., of specific k-space lines), may therefore take place more precisely.

The interpolation of the temperature values may take place assuming a predetermined mathematical relation, e.g., according to a linear, square, polynomial, and/or exponential function of time.

A further embodiment of the method provides that the determination of the temperature values includes a calculation of at least one temperature value based on a temperature model. Advantageously, the temperature values may be determined more precisely by using the temperature model and/or it is possible to dispense with their measurement with a temperature detection unit.

Temperature values may be calculated for time instants at which the acquisition of the image data takes place. In particular, temperature values may be calculated for time instants at which the acquisition of the image data of specific k-space lines takes place. Advantageously, the correction of this image data, (e.g., of specific k-space lines), may therefore take place more precisely.

A further embodiment of the method provides that a mode of operation of a gradient coil unit of the magnetic resonance device is incorporated into the temperature model. As a result, the gradient coil unit in particular may be better taken into account as the heat source.

A further embodiment of the method provides that at least one temperature value, which is measured with the temperature detection unit, is incorporated into the temperature model. As a result, the temperature model may be calibrated.

The temperature model may use a gradient pattern, which is applied for operation of the gradient coil unit and/or a temperature value, which is measured at the start of the acquisition of the image data.

A further embodiment of the method provides that the acquisition of the image data includes an acquisition of k-space portions. Here, the k-space portions may be acquired temporally in sequence. For instance, a first k-space portion, then a second k-space portion, etc. is acquired, e.g., until the entire k-space is acquired. A k-space portion may be a k-space line and/or a k-space spoke and/or another associated k-space trajectory, for instance.

In particular, a k-space portion may include a number of, (e.g., 3 to 20), k-space lines. In particular, a k-space portion may include a number of k-space lines, which are acquired within an echo train.

In particular, a k-space portion may include a number of k-space lines, which are distanced from one another by a duration ES in each instance. The start time instants of two k-space portions may be distanced from one another by a duration TR in each case, wherein TR>ES. Here, TR may lie in the region of 500 milliseconds to 12 seconds, ES may lie in the region of 0.5 milliseconds (ms) to 15 ms, and a portion may include 1 to 512 per slice.

The image data of each acquired k-space portion, (e.g., each acquired k-space line), may be corrected individually.

At least one, (e.g., precisely one), temperature value may be determined for each acquired k-space portion, e.g., for each acquired k-space line.

For instance, the image data of each acquired k-space line is corrected individually based on the temperature value determined for the respective k-space line. In particular, as a result the correction of the image data of the k-space lines may take place particularly accurately.

The acquisition of the image data may take place according to a turbo spin echo sequence (TSE sequence) and/or a gradient echo sequence (GRE sequence). Precisely with these sequences, a particularly strong development of heat may emerge from the operation of the gradient coil unit, the effects of which may advantageously be reduced by the correction of the image data.

A TSE sequence may be a rapid multi-echo sequence. In this context, each echo of a pulse train may obtain another phase encoding. As many k-space lines may be received within a repetition time as the pulse train contains echoes. A rephasing 180° RF pulse may be generated for each k-space line. Contrary to this, pairs of dephasing and rephasing gradient pulses may be generated with a GRE sequence.

A further embodiment of the method provides that the correction of the image data includes a determination of correction values by the first navigator data and the second navigator data, wherein the determined correction values are interpolated based on temperature values, wherein the image data is corrected by the interpolated correction values.

The correction of the image data may include a correction with respect to temperature-dependent parameters, such as a temporal echo position, a phase, and/or a frequency. In particular, temperature-dependent parameters, such as a temporal echo position, a phase, and/or a frequency, are assigned to the correction values.

The interpolation of the correction values may take place, e.g., assuming a predetermined mathematical relation, for instance according to a linear, quadratic, polynomial, and/or exponential function of time.

The acquisition of the image data may include an acquisition of k-space portions, (e.g., k-space lines), wherein at least one correction value is determined for each acquired k-space portion.

A first set of correction values and a second set of correction values may be determined from the first navigator data and the second navigator data. For instance, each set of correction values includes in each case a correction value for a temporal echo position, a phase, and/or a frequency.

In particular, intermediate values, (e.g., intermediate sets of correction values), between the first set of correction values and the second set of correction values, may be generated by interpolation based on the temperature values. One such intermediate set of correction values may in turn include in each case a correction value for a temporal echo position, a phase, and/or a frequency.

A separate temperature value may be used to determine any intermediate set of correction values. An acquired k-space portion, (e.g., an acquired k-space line), may be assigned to each intermediate set. Therefore, each acquired k-space portion may advantageously be individually corrected in a temperature-dependent manner.

A further embodiment of the method provides that the acquisition of the image data includes the acquisition of the first navigator data or the second navigator data.

For instance, it is possible to a acquire a non-phase-encoded k-space line as navigator data at the start and/or at the end of the acquisition of the image data. In particular, it is possible to acquire a non-phase-encoded k-space line as navigator data at the start and/or at the end of an echo train, with which image data is acquired. By the simultaneous acquisition of navigator data and image data, the duration of the acquisition may be shortened overall.

For instance, the acquisition of the image data includes the acquisition of a central k-space line, wherein the acquisition of the central k-space line includes the acquisition of the first navigator data or the second navigator data.

A further embodiment of the method provides that the acquisition of the image data includes an acquisition of image data from a number of slices of the examination object, wherein navigator data is acquired for each slice, wherein the navigator data is averaged. As a result, the correction of the image data may advantageously be carried out more reliably.

The correction of the image data may only take place by the first navigator data and the second navigator data. Furthermore, it is proposed that in addition to the first navigator data and the second navigator data, at least further navigator data is still acquired, wherein the correction of the image data additionally takes place by the further navigator data. As a result, more support points for interpolation of the correction values may be determined for instance so that a more stable fitting of the correction values is in particular enabled.

Furthermore, a magnetic resonance device is proposed, which is embodied to execute the previously described method for correcting image data acquired by a magnetic resonance device. One such magnetic resonance device may include a system control unit, which is embodied to carry out a correction of acquired image data from acquired navigator data and determined temperature values. In particular, one such magnetic resonance device may include a temperature detection unit, which is embodied to measure at least one temperature value of the magnetic resonance device.

The advantages of the proposed magnetic resonance device substantially correspond to the advantages of the method for correcting image data acquired by a magnetic resonance device, which are embodied in detail above. Features, advantages, or alternative embodiments mentioned here may likewise also be transferred to the other claimed subject matters and vice versa.

Furthermore, a computer program product is proposed which includes a program and is directly loadable into a memory of a programmable system control unit of a magnetic resonance device, and has program modules or means, for example libraries and auxiliary functions, in order to execute a method described previously for correcting image data acquired by a magnetic resonance device, when the computer program product is executed in the system control unit of the magnetic resonance device. Here, the computer program product may include an item of software with a source code that is compiled and linked, or which is only interpreted, or an executable software code which, for execution, is loaded into the system control unit. By the computer program product, the method may be performed rapidly, exactly reproducibly, and robustly. The computer program product is configured so that it may execute the method acts by the system control unit. The system control unit here has the pre-conditions in each case such as, for example, a suitable working memory store, a suitable graphics card, or a suitable logic unit so that the respective method acts may be executed efficiently. The computer program product is stored, for example, on a computer-readable medium or is deposited on a network or server from where it may be loaded into the processor of a local system control unit which may be directly connected to, or configured as part of, the magnetic resonance device. Furthermore, control information of the computer program product may be stored on an electronically readable data carrier. The control information of the electronically readable data carrier may be configured so that it carries out a method when the data carrier is used in a system control unit of a magnetic resonance device. Examples of electronic readable data carriers are a DVD, a magnetic tape, or a USB stick, on which is stored electronically readable control information, in particular software. If this control information is read from the data carrier and stored in a system control unit of the magnetic resonance device, all the embodiments of the above-described methods may be carried out. The disclosure may therefore also proceed from the aforementioned computer-readable medium and/or the aforementioned electronically readable data carrier.

BRIEF DESCRIPTION OF THE DRAWINGS

Further advantages, features, and details are disclosed in the following description of exemplary embodiments and by reference to the drawings. Parts which correspond to one another are provided with the same reference characters in all the figures.

In the drawings.

DETAILED DESCRIPTION

Figure 1:
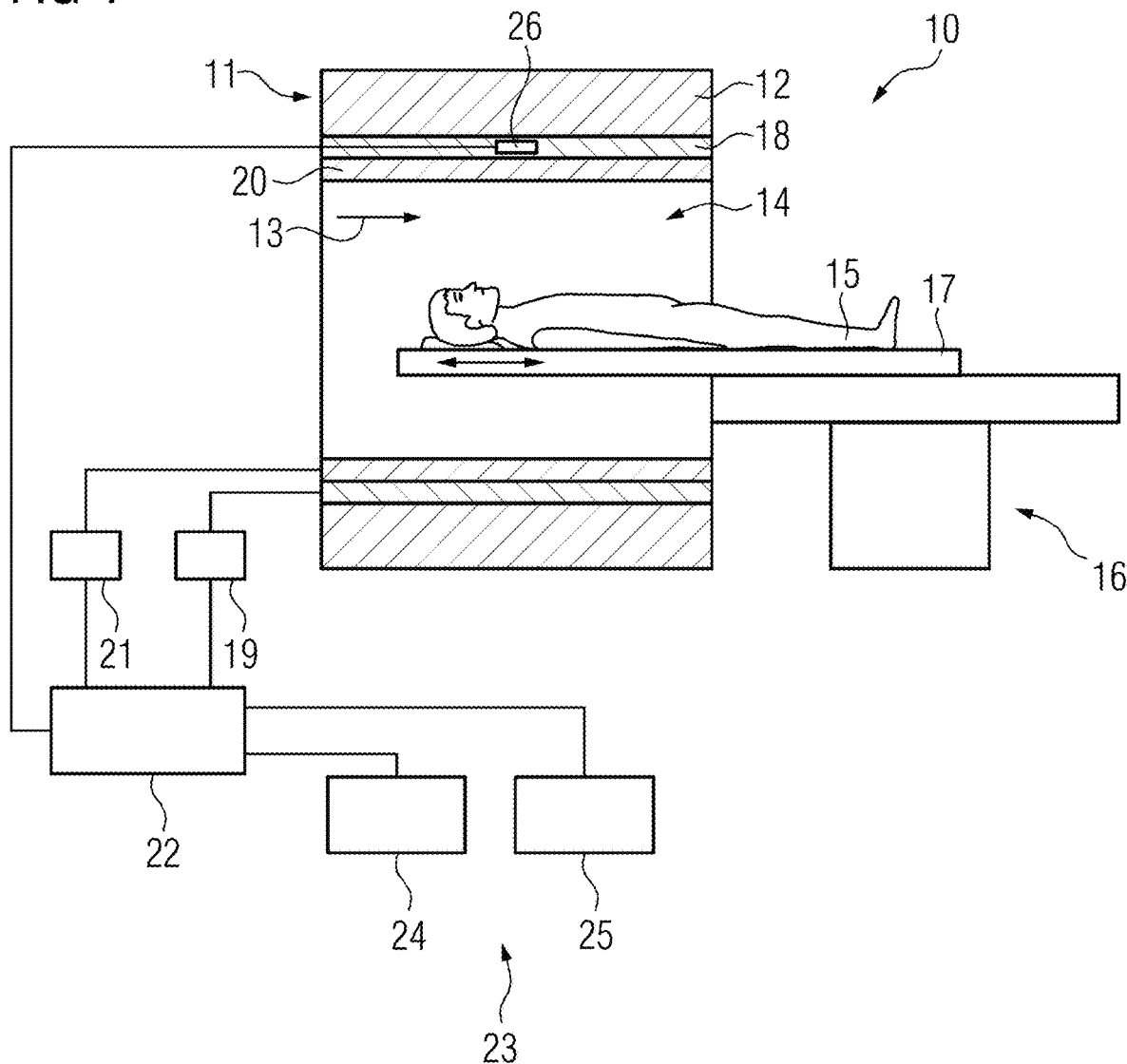
FIG. 1 depicts a schematic representation of an example of a magnetic resonance device, which is embodied to carry out a method for correcting image data acquired by the magnetic resonance device.

FIG. 1 depicts an exemplary magnetic resonance device 10 schematically. The magnetic resonance device 10 includes a magnet unit 11, which has a main magnet 12 for generating a strong and, in particular, temporally constant main magnetic field 13. Moreover, the magnetic resonance device 10 includes a patient receiving area 14 for receiving a patient 15. In the present exemplary embodiment, the patient receiving area 14 is embodied to be cylindrical and in a peripheral direction is surrounded by the magnet unit 11 in a cylindrical manner. In principle, however, the patient receiving area 14 may have a different design. The patient 15 may be moved into the patient receiving area 14 by a patient support apparatus 16 of the magnetic resonance device 10. The patient support apparatus 16 has for this purpose a patient couch 17, which is designed to be able to move inside the patient receiving area 14.

The magnet unit 11 further has a gradient coil unit 18 for generating magnetic field gradients, which are used for spatial encoding during imaging. The gradient coil unit 18 is controlled by a gradient control unit 19 of the magnetic resonance device 10. The magnet unit 11 also includes a radiofrequency antenna unit 20, which in the present exemplary embodiment is designed as a body coil that is fixedly integrated in the magnetic resonance device 10. The radiofrequency antenna unit 20 is designed to excite atomic nuclei, which excitation is established in the main magnetic field 13 produced by the main magnet 12. The radiofrequency antenna unit 20 is controlled by a radiofrequency antenna control unit 21 of the magnetic resonance device 10 and radiates radiofrequency magnetic resonance sequences into an examination space, which is largely formed by a patient receiving area 14 of the magnetic resonance device 10. The radiofrequency antenna unit 20 is also designed to receive magnetic resonance signals.

The magnetic resonance device 10 has a system control unit 22 for controlling the main magnet 12, the gradient control unit 19, and the radiofrequency antenna control unit 21. The system control unit 22 centrally controls the magnetic resonance device 10, for instance, implementing a predetermined imaging sequence, e.g., a TSE or a GRE sequence. One such sequence may also include the detection of navigator data. Moreover, the system control unit 22 includes an evaluation unit (not shown in more detail) for evaluating medical image data, which is detected during the magnetic resonance examination. In addition, the magnetic resonance device 10 includes a user interface 23, which is connected to the system control unit 22. Control information, (such as imaging parameters as well as reconstructed magnetic resonance images), may be indicated on a display unit 24, (e.g., on at least one monitor), of the user interface 23 for a medical operating personnel. In addition, the user interface 23 has an input unit 25, which may be used by the medical operating personnel to enter data and/or parameters during a measurement process.

The magnetic resonance device 10 further has a temperature detection unit 26, which may detect temperature values and transmit them to the system control unit 22. In the case shown, the temperature detection unit 26 is arranged on the gradient coil unit 18. The gradient coil unit 18 may include a number of, in particular three, gradient coils. High electric currents, which contribute to heating the magnetic resonance device 10, may flow through the gradient coils during operation of the magnetic resonance device 10. Such a heating may be particularly effectively detected by positioning the temperature detection unit 26 on the gradient coil unit. The temperature detection unit 26 may also include a number of temperature sensors, which are distributed across a number of points on the magnetic resonance device 10, for instance.

Figure 2:
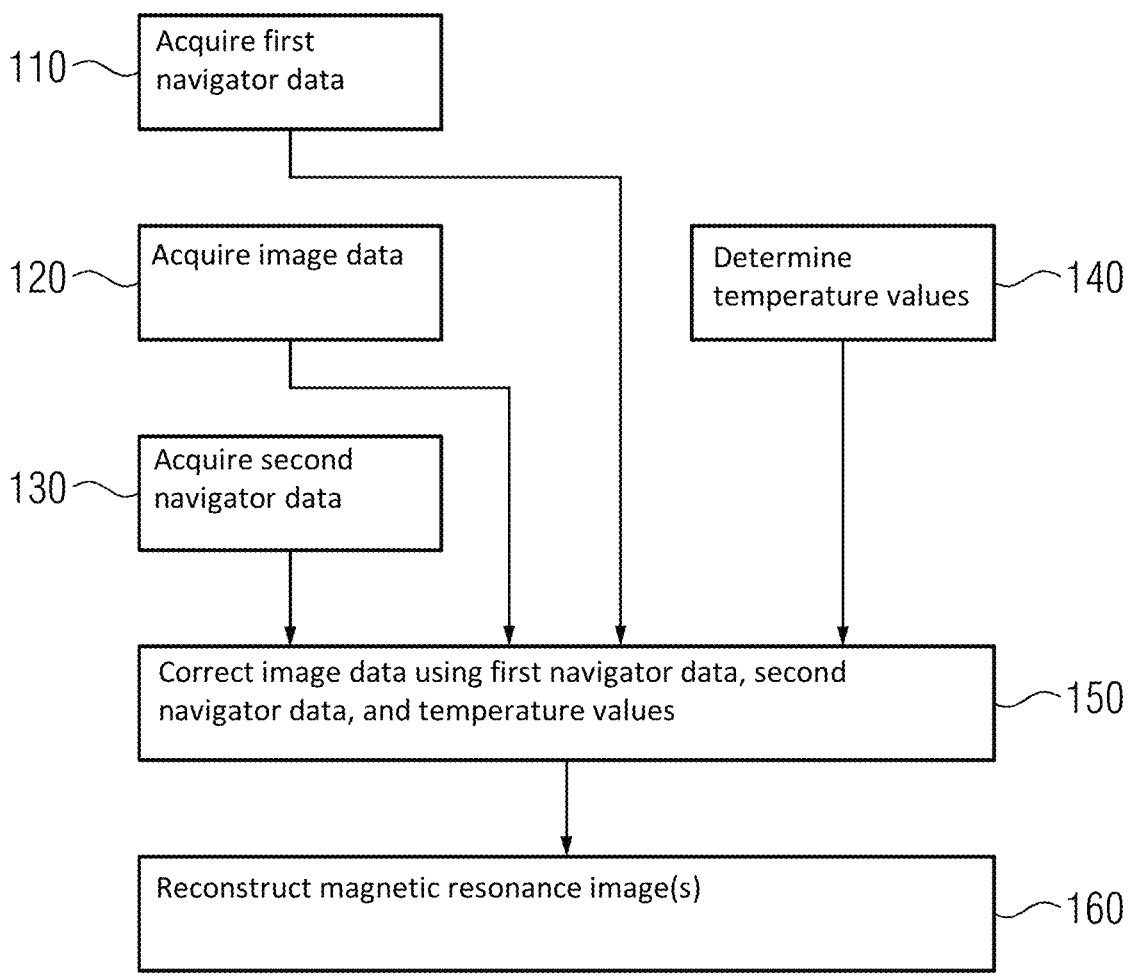
FIG. 2 depicts a flow chart of an example of a method for correcting image data acquired by a magnetic resonance device.
Figure 3:
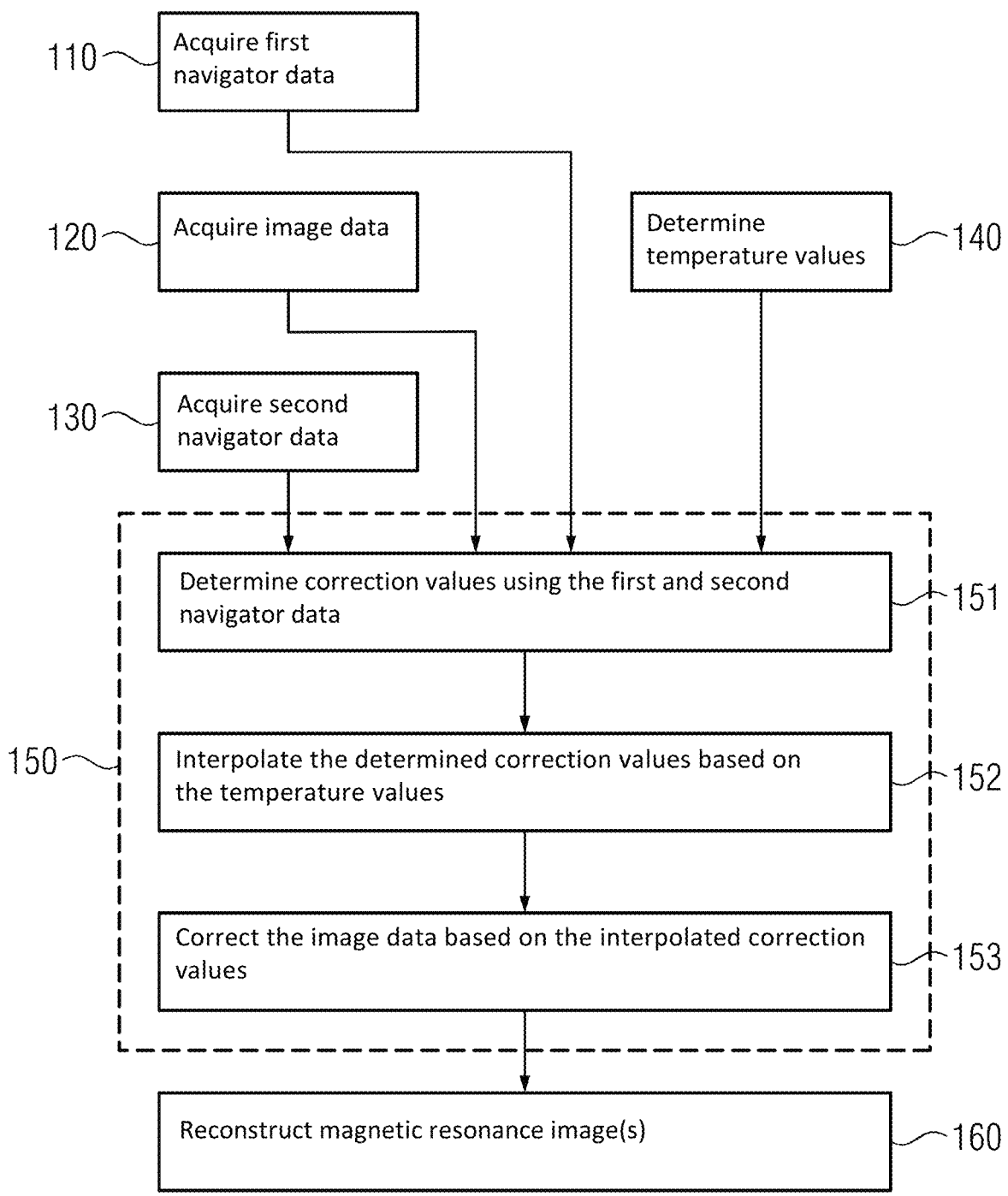
FIG. 3 depicts an extended flow chart of an example of a method for correcting image data acquired by a magnetic resonance device.

The magnetic resonance device 10 is embodied to carry out a method for correcting image data acquired by the magnetic resonance device. By way of example, embodiments of such methods are shown in FIGS. 2 and 3.

According to FIG. 1, first navigator data is acquired in act 110. Image data is acquired in act 120. Second navigator data is acquired in act 130. Temperature values of the magnetic resonance device 10 are determined in act 140. In act 150, the image data is corrected by the first navigator data, the second navigator data, and the temperature values. In act 160, one or more magnetic resonance images are reconstructed from the corrected image data.

The first navigator data, the image data, and the second navigator data are magnetic resonance signals generated by a suitable resonant excitation of atomic nuclei of the patient 5 according to an imaging sequence. The first navigator data, the image data, and the second navigator data may be received by the radiofrequency antenna unit 20 and transmitted to the system control unit 22.

The determination of the temperature values in act 140 may take place by measuring temperature values with a temperature detection unit 26, for instance. If the temperature values are measured at temporal intervals, further temperature values may be generated by interpolation of the measured temperature values for times between the measuring points.

In addition, or alternatively to an interpolation of the temperature values, further temperature values may also be calculated based on a temperature model. One such temperature model may take into account the mode of operation, (e.g., the control), of the gradient coil unit 18, for instance. The mode of operation is in particular determined by the type and frequency of gradient pulses, which are played out by the gradient coil unit 18. The mode of operation of the gradient coil unit 18 may be derived from the sequence, with which the image data is acquired. One or more temperature values measured with the one temperature detection unit 26 may also be incorporated into the temperature model in order to calibrate the temperature model, for instance.

Figure 4:
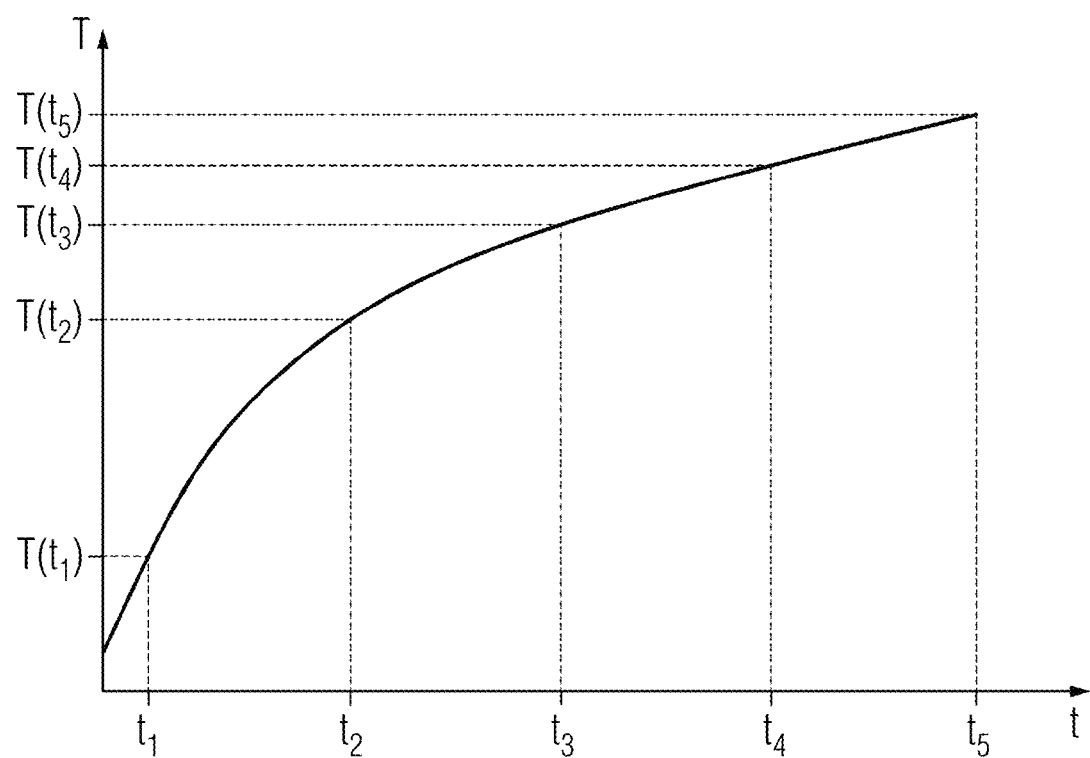
FIG. 4 depicts an example of a diagram of a temperature curve of the magnetic resonance device.

By way of example, a temperature curve T is shown against time t in FIG. 4. The temperature curve represents the temperature of the gradient coil unit 18, for instance. In act 140, temperature values $T(t_1)$, $T(t_3)$, and $T(t_5)$ are measured with the temperature detection unit 26 at time instants $t_1$, $t_3$, and $t_5$, and further temperature values $T(t_2)$ and $T(t_4)$ are determined for time instants $t_2$ and $t_4$ by interpolation and/or based on a temperature model.

Furthermore, in act 110, at time instant $t_1$, first navigator data is acquired. Additionally, in act 130, at time instant $t_5$, second navigator data is acquired.

The acquisition of the image data in 120 may include an acquisition of k-space portions. Such k-space portions may be k-space lines. The correction of the acquired image data in 150 may take place individually for the k-space portions. For instance, a separate correction is carried out for each k-space line. Moreover, one or more temperature values may be determined for each acquired k-space portion. As exact an individual correction of the image data of the acquired k-space portion as possible may thus be achieved, for instance.

In relation to FIG. 4, a first k-space portion is acquired at time instant $t_1$ and a second k-space portion is acquired at time instant $t_2$, etc. In act 150, an individual correction is carried out for each of these k-space portions by the first navigator data, the second navigator data, and the temperature values.

FIG. 3 depicts a possible correction of the image data in act 150. Here, in act 151, correction values are determined by the first navigator data and the second navigator data. For instance, the correction values $\alpha_i$ and $\beta_i$, (which relate to different temperature-dependent parameters, such as frequency, phase, or a temporal echo position), are determined by the first navigator data. The correction values $\alpha_f$ and $\beta_f$ are also determined by the second navigator data.

In act 152, the determined correction values are interpolated based on the temperature values $T(t_1)$, $T(t_2)$, ... e.g. according to:

$$\alpha(t) = \alpha_i + c \times (\alpha_f - \alpha_i) \times (T(t) - d),$$

$$\beta(t) = \beta_i + e \times (\beta_f - \beta_i) \times (T(t) - f),$$

wherein c, d, e, and f are fit parameters.

Accordingly, in act 153, the image data which has been acquired at the time instants $t_1, t_2, \ldots$ may be retrospectively corrected based on the interpolated correction values $\alpha(t_1)$, $\beta(t_2)$, $\alpha(t_2)$, $\beta(t_2)$, ....

Figure 5:
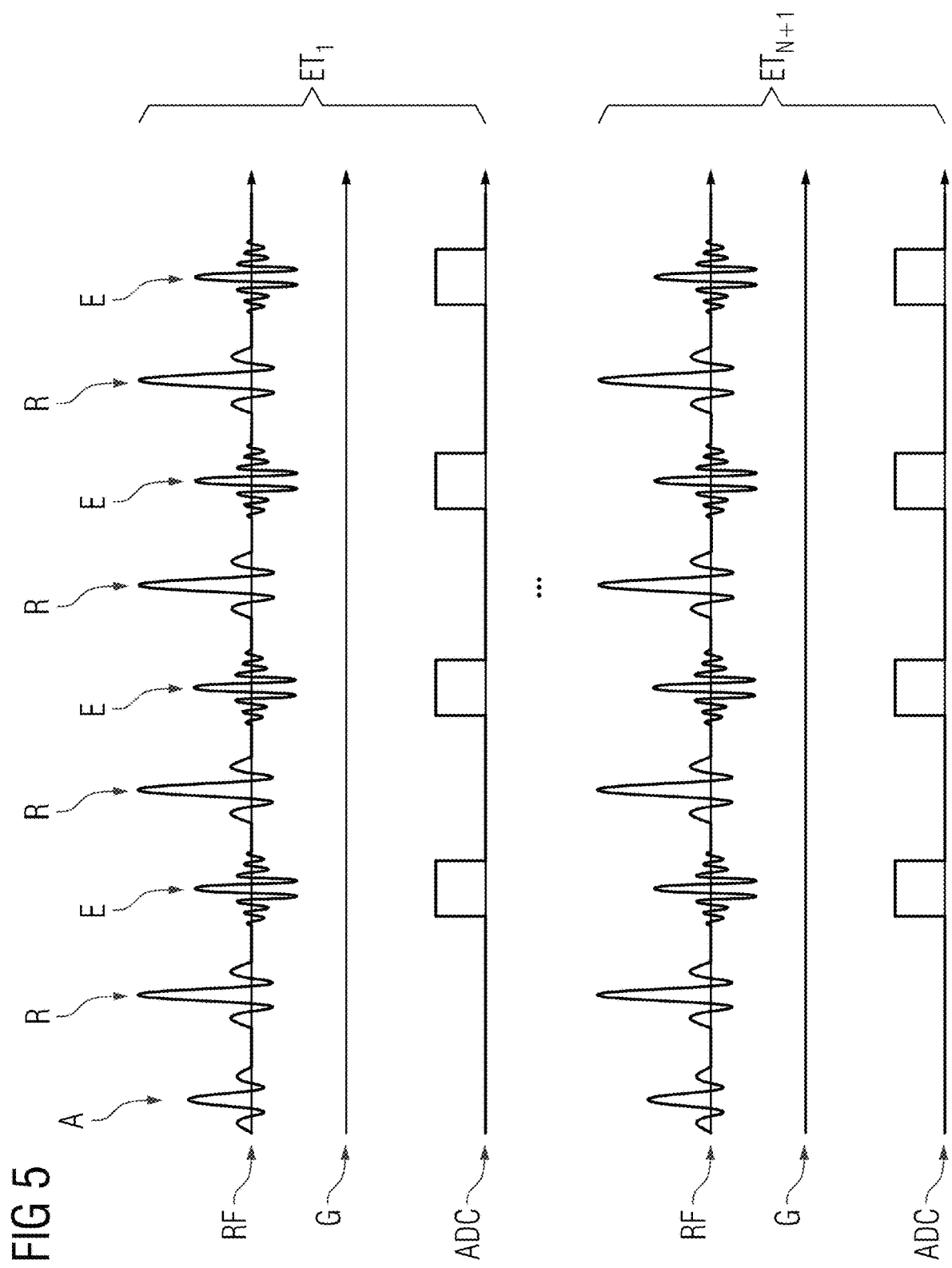
FIG. 5 depicts an example of a diagram of a sequence with N+1 echo trains.

An exemplary diagram of a TSE sequence is shown schematically in FIG. 5. An excitation pulse A, a number of refocusing pulses R, and echo signals E are shown on the axis RF. The echo signals E are acquired as image data by an analog-digital converter ADC. A k-space line is acquired here with each echo signal E. A first echo train $ET_1$ is shown in the upper part of FIG. 5, and a N+1 echo train $ET_{N+1}$ is shown in the lower part. With both echo trains, no phase encoding is performed by a phase encoding gradient G. Each echo E may be used here as navigator data to correct the image data.

Figure 6:
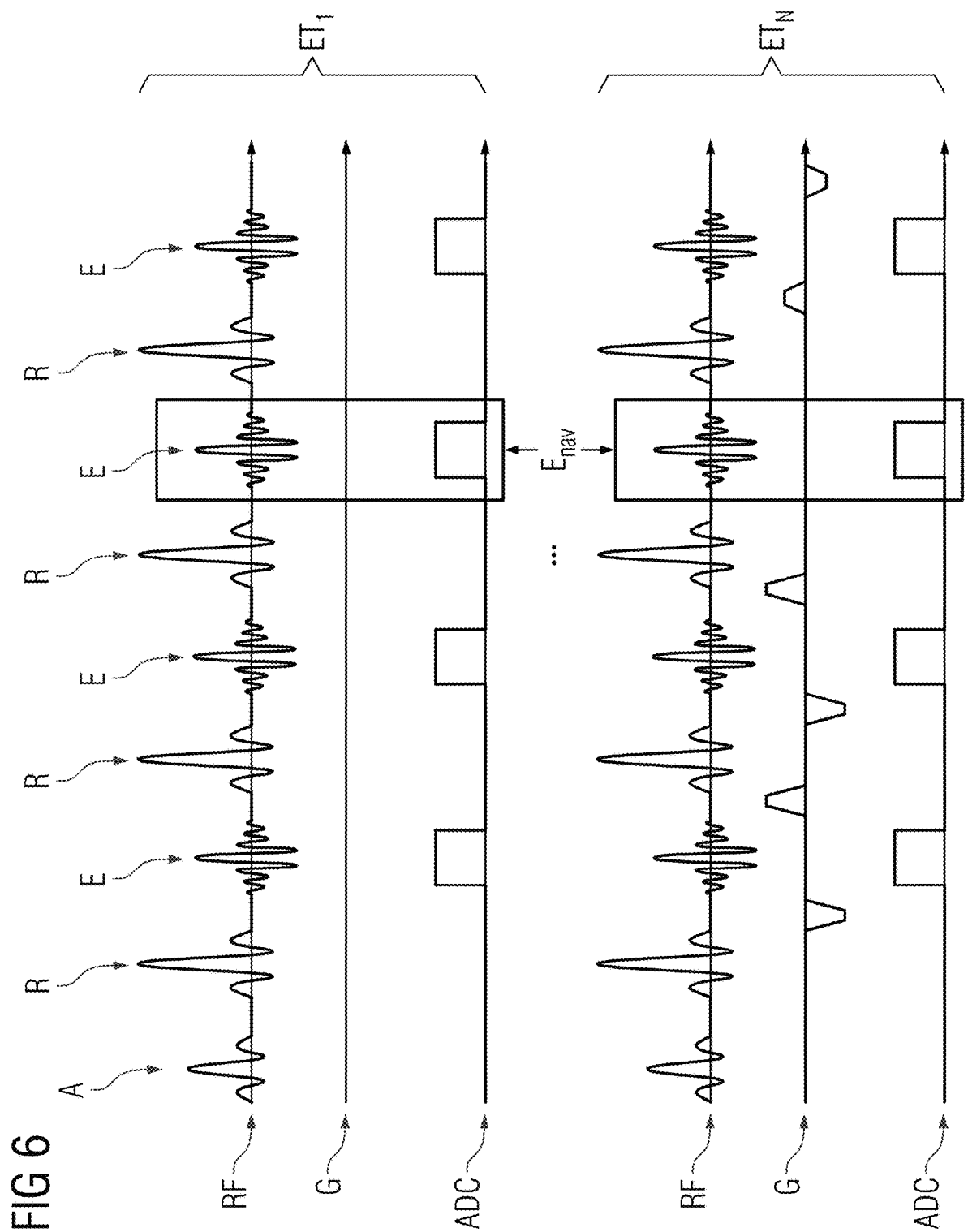
FIG. 6 depicts an example of a diagram of a sequence with N+1 echo trains.
Figure 7:
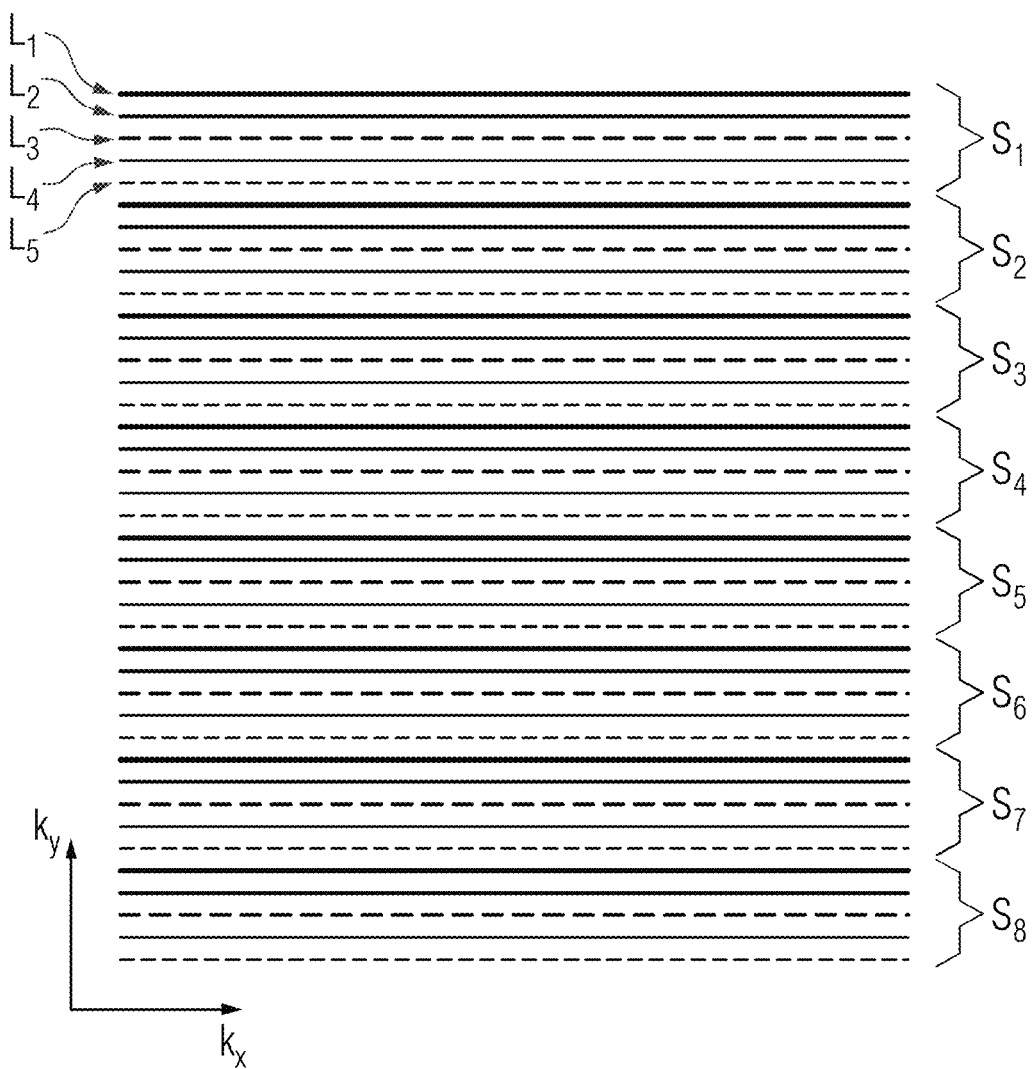
FIG. 7 depicts an example of a diagram of a k-space.

In further echo trains $ET_2$ to $ET_N$ not shown here, image data may be acquired, (e.g., in order to fill a k-space), as shown in FIG. 7. The k-space is spanned here by a phase encoding direction $k_y$ and a frequency encoding direction $k_x$. (The frequency encoding is not shown in FIGS. 5 and 6).

Here, the k-space is divided into 8 segments $S_1$-$S_8$. Each segment includes 5 k-space lines, which are provided for the segment S1 with reference characters $L_1$-$L_5$. A k-space line is acquired in an echo train for each of the segments $S_1$-$S_8$. In particular, if differences in respect of a global phase or gradient delay offset between echo trains occur on account of heating, artifacts may occur, (e.g., ghost images may occur). Such effects may be reduced by correcting the image data in act 150.

FIG. 6 depicts an advantageous embodiment of the sequence, in which compared with the sequence shown in FIG. 5, it is possible to dispense with the echo train $ET_{N+1}$ at the end of the sequence. The acquisition time may be shortened by dispensing with the echo train $ET_{N+1}$. Here, $L_{nav}$ is acquired in each instance at the start of the sequence in the echo train $ET_1$ and an individual k-space line is acquired in each instance at the end of the sequence in the echo train $ET_N$ by the echo $E_{nav}$. For instance, the sequence of the acquisition of the k-space lines may be selected so that a central k-space line is acquired in the last echo train $ET_N$ of the acquisition of the image data. The central k-space line may be used as second navigator data. The acquisition of the image data may therefore include the acquisition of the second navigator data. The non-phase-encoded k-space line at the start of the acquisition may be used as a first k-space line.

A two-dimensional k-space, as shown schematically in FIG. 7, may include image data from a slice of the examination object 15. If image data is acquired from a number of slices of the examination object 15, navigator data, which is averaged, may advantageously be acquired for each slice. As a result, the stability of the method may be improved in particular.

Furthermore, in addition to the first navigator data and the second navigator data, further navigator data may still be acquired, e.g., during the acquisition of an individual slice. As a result, the stability of the method may also be improved in particular.

In the exemplary embodiments shown here by way of example, the method was applied to a TSE sequence. It may however also advantageously be applied to other sequence types, the acquired image data of which is negatively influenced by heating the magnetic resonance device 10. It may be applied to an echoplanar imaging (EPI), for instance. In this way, it is possible to dispense with a 3 echo $B_0$ navigator, which may precede each echo train, in order to reproduce an echo time TE, but nevertheless in order to carry out a correction of a B0 drift. Phase-sensitive applications, (e.g., flow measurements and MR elastography), are further possible examples which may profit from the proposed method.

It should again be noted that the methods and the magnetic resonance device described above in detail are merely exemplary embodiments which may be modified by a person skilled in the art in a wide variety of ways without departing from the scope of the disclosure. In addition, the use of the indefinite article "a" or "an" does not preclude the relevant features also being present plurally. Similarly, the expression "unit" does not exclude the relevant components consisting of a plurality of cooperating subcomponents which may also be spatially distributed if required.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for correcting image data acquired by a magnetic resonance device, the method comprising:

acquiring, by the magnetic resonance device, first navigator data;

acquiring, by the magnetic resonance device, image data;

acquiring, by the magnetic resonance device, second navigator data;

determining temperature values of the magnetic resonance device, wherein each temperature value comprises an item of time information as a function of time instants of the acquisitions of the first navigator data, the image data, and the second navigator data; and correcting the image data using the first navigator data, the second navigator data, and the temperature values.

2. The method of claim 1, wherein the determining of the temperature values comprises measuring at least one temperature value with a temperature detection unit.

3. The method of claim 1, wherein the determining of the temperature values comprises calculating at least one temperature value based on a temperature model.

4. The method of claim 1, wherein the acquiring of the image data comprises acquiring image data of k-space portions, and wherein the image data of the k-space portions is corrected individually.

5. The method of claim 1, wherein the acquiring of the image data comprises acquiring k-space portions, wherein at least one temperature value is determined for each acquired k-space portion, and wherein the image data of each acquired k-space portion is corrected individually based on the at least one temperature value determined for the respective k-space portion.

6. The method of claim 1, wherein the correcting of the image data comprises:

determining correction values from the first navigator data and the second navigator data;

interpolating the correction values are based on the determined temperature values; and correcting the image data using the interpolated correction values.

7. The method of claim 1, wherein the correcting of the image data comprises a correction with respect to a frequency, a phase, a temporal echo position, or a combination thereof.

8. The method of claim 1, wherein the acquiring of the image data comprises the acquiring of the first navigator data or the second navigator data.

9. The method of claim 1, wherein the acquiring of the image data comprises:

acquiring image data from a number of slices of an examination object;

acquiring navigator data for each slice; and averaging the navigator data.

10. The method of claim 1, further comprising:

acquiring further navigator data in addition to the first navigator data and the second navigator data, wherein the correcting of the image data additionally takes place by the further navigator data.

11. The method of claim 1, wherein the temperature values are determined at the time instants of the acquisitions of the image data.

12. The method of claim 1, wherein the temperature values of the magnetic resonance device comprise temperature values of one or more components of the magnetic resonance device.

13. The method of claim 12, wherein the one or more components of the magnetic resonance device comprise one or more gradient coils.

14. The method of claim 2, wherein the at least one temperature value is measured temperature values, and wherein the determining of the temperature values further comprises interpolating the measured temperature values.

15. The method of claim 3, wherein a mode of operation of a gradient coil unit of the magnetic resonance device is incorporated into the temperature model.

16. The method of claim 11, wherein the temperature values are determined at the time instants of the acquisitions of the image data for specific k-space lines.

17. The method of claim 15, further comprising:

measuring at least one temperature value with a temperature detection unit, wherein the at least one temperature value is incorporated into the temperature model.

18. A magnetic resonance device comprising:

a system controller configured to:

acquire first navigator data;

acquire image data;

acquire second navigator data;

determine temperature values of the magnetic resonance device, wherein each temperature value comprises an item of time information as a function of time instants of the acquisitions of the first navigator data, the image data, and the second navigator data; and correct the image data using the first navigator data, the second navigator data, and the temperature values.

19. A non-transitory computer program product which comprises a computer program and is directly loadable into a memory of a programmable computer unit of a system control unit of a magnetic resonance device, wherein the computer program, when executed in the computer unit of the system control unit, is configured to cause the magnetic resonance device to:

acquire first navigator data;

acquire image data;

acquire second navigator data;

determine temperature values of the magnetic resonance device, wherein each temperature value comprises an item of time information as a function of time instants of the acquisitions of the first navigator data, the image data, and the second navigator data; and correct the image data using the first navigator data, the second navigator data, and the temperature values.

* * * * *